(12) United States Patent
Li et al.

(10) Patent No.: US 11,617,274 B2
(45) Date of Patent: Mar. 28, 2023

(54) ELECTRONIC DEVICE AND DISPLAY COMPONENT THEREOF

(71) Applicant: Lenovo (Beijing) Co., Ltd., Beijing (CN)

(72) Inventors: Xiaohua Li, Beijing (CN); Yingfeng Ma, Beijing (CN); Ning Hao, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/728,922

(22) Filed: Dec. 27, 2019

(65) Prior Publication Data

US 2020/0214147 A1    Jul. 2, 2020

(30) Foreign Application Priority Data

Dec. 29, 2018  (CN) ......................... 201811642828.1
Dec. 29, 2018  (CN) ......................... 201811647576.1

(51) Int. Cl.
*H05K 5/00*  (2006.01)
*H05K 5/03*  (2006.01)

(52) U.S. Cl.
CPC ............. *H05K 5/0017* (2013.01); *H05K 5/03* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 2014/0240911 A1* | 8/2014 | Cole | B29C 45/14434 361/679.3 |
| 2016/0062391 A1* | 3/2016 | Choi | H04M 1/0266 361/679.03 |
| 2018/0132020 A1 | 5/2018 | Seo et al. | |

FOREIGN PATENT DOCUMENTS

| | | |
|---|---|---|
| CN | 103543547 A | 1/2014 |
| CN | 106302872 A | 1/2017 |
| WO | 2018151412 A1 | 8/2018 |

* cited by examiner

*Primary Examiner* — Jerry Wu
(74) *Attorney, Agent, or Firm* — Anova Law Group, PLLC

(57) ABSTRACT

A display component includes a display screen, and a transparent cover covering the display screen. The transparent cover includes a first portion and a second portion. The first portion covers a display area of the display screen, and a shape of a projection of the first portion on a reference plane is substantially rectangular. The second portion extends outward from the first portion to form a protruding portion.

9 Claims, 9 Drawing Sheets

ELECTRONIC DEVICE AND DISPLAY COMPONENT THEREOF

CROSS-REFERENCE TO RELATED APPLICATION

This application claims the priority to Chinese Patent Application Nos. 201811647576.1 and 201811642828.1, both entitled "Electronic Device and Display Component" and filed on Dec. 29, 2018, the entire contents of which are incorporated herein by reference.

TECHNICAL FIELD

The present disclosure relates to the technical field of electronic devices, and in particular relates to a display component, and an electronic device having the display component.

BACKGROUND

Full-screen is one of the main trends in the development of electronic device displays such as those for mobile phones and laptop computers. Therefore, manufacturers of electronic devices are committed to pursuing the effect of large viewing area on a display. However, oftentimes in mobile phones and laptop computers, since a camera needs to be disposed at the top of the screen, accordingly, the camera occupies a part of the screen area, which affects the full-screen effect of electronic device. In addition, in laptop computers, the display screens are conventional flat-edge display screens. The screen ratio of such display screens is usually not high, which also affects the user experience.

SUMMARY

According to one aspect of the present disclosure, a display component is provided. The display component includes a display screen, and a transparent cover covering the display screen. The transparent cover includes a first portion and a second portion. The first portion covers a display area of the display screen, and a shape of a projection of the first portion on a reference plane is substantially rectangular. The second portion extends outward from the first portion to form a protruding portion.

According to another aspect of the present disclosure, an electronic device is provided. The electronic device includes a display component, a housing for mounting the display component, and a sensor disposed on the electronic device. The display component includes a display screen. A transparent cover covering the display screen includes a first portion and a second portion. The first portion covers a display area of the display screen, and a shape of a projection of the first portion on a reference plane is substantially rectangular. The second portion extends outward from the first portion to form a protruding portion, and the second portion covers the sensor.

BRIEF DESCRIPTION OF THE DRAWINGS

In order to explain the technical solutions in the embodiments of the present disclosure or the existing technologies more clearly, the drawings used in the embodiments or the description of the existing technologies will be briefly introduced below. Apparently, the drawings in the following description are merely embodiments of the present disclosure. For a person of ordinary skill in the art, other drawings can be obtained according to the provided drawings without creative efforts.

Numeral references: 1—transparent cover; 2—display screen; 3—housing; 4—lower mold; 5—first groove; 6—third groove; 7—assembly groove; 8—outer edge; 9—chamfer; 10—sensor; 11—first body; 12—second body; 101—first edge; 102—second edge; 103—second line segment; 104—third edge; 105—first part; 106—second part; 301—first side wall; 302—first protrusion; 303—second side wall; 304—second projection; 305—top wall; 3051—first step surface; 3052—second step surface; 3053—connecting surface; 3054—first top edge; 3055—second top edge; 3056—first sub-edge; 3057—second sub-edge.

DETAILED DESCRIPTION OF THE EMBODIMENTS

The present disclosure provides a display component having a high screen ratio of a display area, which also facilitates the enhancement of user experience.

The technical solutions in the embodiments of the present disclosure will be clearly and completely described below with reference to the drawings in the embodiments of the present disclosure. Apparently, the described embodiments are only a part of the embodiments of the present disclosure, but not all of the embodiments. Based on the embodiments in the present disclosure, all other embodiments obtained by a person of ordinary skill in the art without creative efforts shall fall within the protected scope of the present disclosure.

Figure 1:
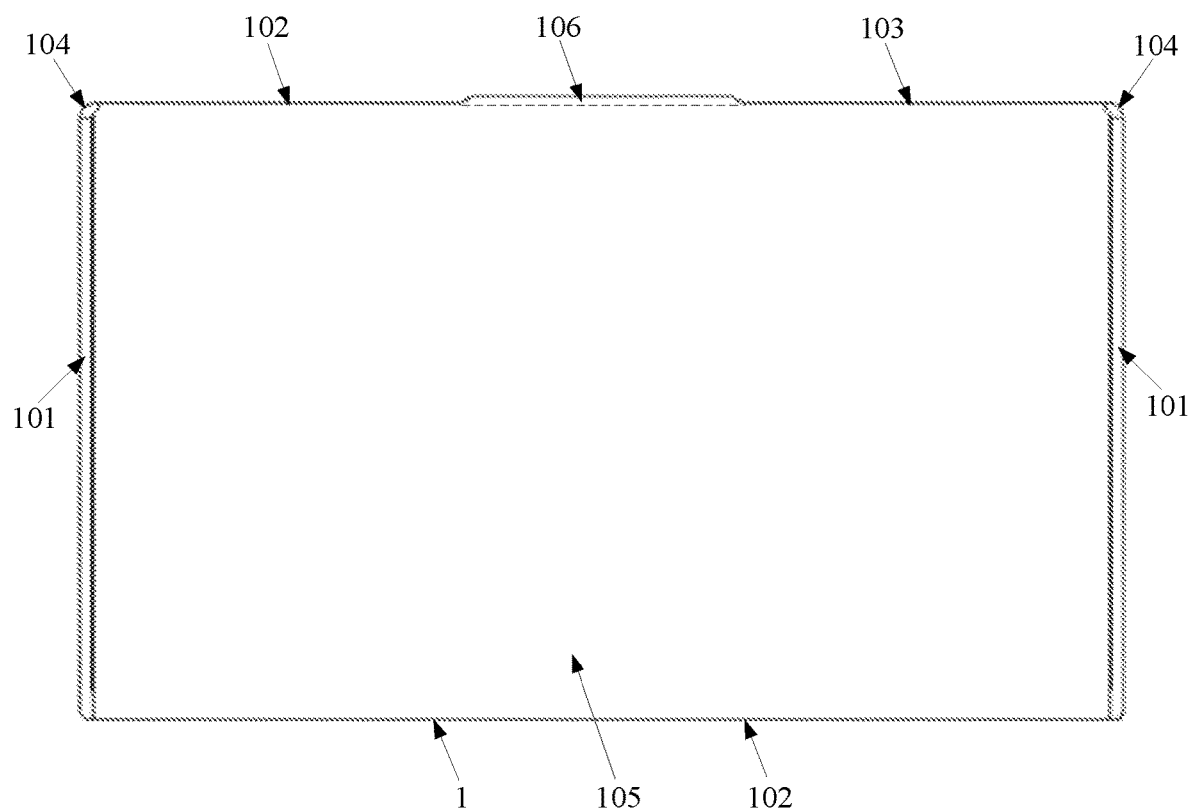
FIG. 1 illustrates a front view of a transparent cover according to some embodiment of the present disclosure.
Figure 2:
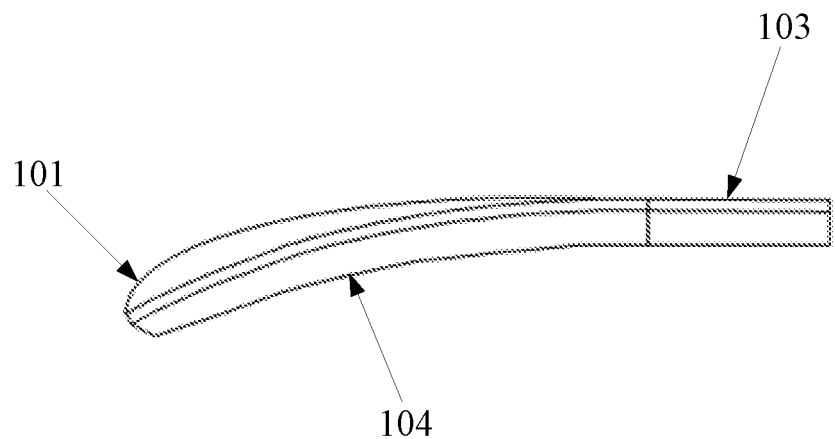
FIG. 2 illustrates a side view of a third edge according to some embodiment of the present disclosure.
Figure 3:
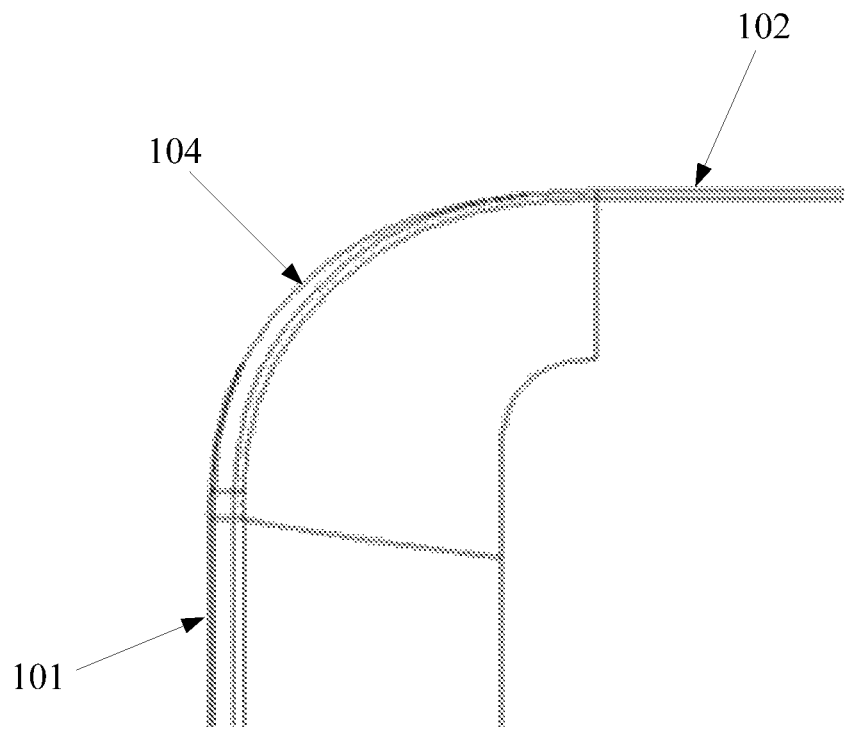
FIG. 3 illustrates a main view of a third edge according to some embodiment of the present disclosure.

According to some embodiment of the present disclosure, as shown in FIGS. 1-5, the present disclosure provides a transparent cover 1 configured to cover the display screen 2. All edges of the transparent cover 1 include a first edge 101, a second edge 102 and a third edge 104. It should be noted that the "first", "second", and "third" are named based on different structures of the edge and they do not refer to multiple different individuals of the same structure. That is, the first edge 101, the second edge 102, and the third edge 104 refer to three types of edges of different structures. The first edge 101 is formed by bending a conventional edge of the transparent cover 1 in a first direction. The first direction is perpendicular to a surface where the transparent cover 1 is located, and the conventional edge refers to an edge coplanar with a main body of the transparent cover 1. That is, the first edge 101 is a curved edge formed by bending; the second edge 102 is an edge disposed adjacent to the first edge 101, and the second edge 102 can be divided into multiple sections in a length direction. In these sections, at least a portion adjacent to the first edge 101 has a second line segment 103 (In the present disclosure, in order to correspond to the naming of the second edge 102, the line segment on the adjacent part of 101 is named as the second line segment 103; however, there is no "first line segment" in this disclosure.). The second line segment 103 is located on a surface of the transparent cover 1; the third edge 104 is located between the first edge 101 and the second edge 102 and is configured to smoothly connect the first edge 101 to the second edge 102. Since the first edge 101 is a curved edge formed by bending to one side with respect to the transparent cover 1, and a part where the second line segment 103 of the second edge 102 is located is coplanar with the transparent cover 1. That is, there is a height difference between a part where the first edge 101 is located and the part where the second line segment 103 is located. Thus, in order to smoothly connect this part of the second edge 102 to the first edge 101, a third edge 104 needs to have at least a partial arc surface, which is also curved in the first direction to be connected to an end surface of the first edge 101, as shown in FIGS. 2 and 3.

The transparent cover 1 with the above structure has not only the second edge 102 coplanar with the transparent cover 1 but also the first edge 101 formed by bending. When the first edge 101 of the transparent cover 1 is configured to cover the display screen 2, a display area of the display screen 2 can be enlarged to the area covered by the edge of the curved surface, thereby increasing the screen ratio of the electronic device using the transparent cover 1 and further improving the user experience of the using electronic device.

Specifically, the above-mentioned transparent cover 1 may be a flat plate that can be used in conjunction with a flat display screen, or may be a curved arc plate that can be used in conjunction with a curved display screen. When the transparent cover 1 is a flat plate, the surface where the transparent cover 1 is located refers to the plane on which the flat plate portion of the transparent cover 1 is located, and the flat plate portion refers to a portion other than an arc surface of the first edge 101 and an arc surface of the third edge 104. When the transparent cover 1 is an arc plate, the surface where the transparent cover is located refers to an arc surface of the main body of the transparent cover 1, and this main body refers to the portion of the transparent cover 1 other than the arc surface of the first edge 101 and the arc surface of the third edge 104. The main body is formed into a large curved surface by bending, so that the transparent cover 1 has a curved structure as a whole, while the arc surface formed by the first edge 101 and the arc surface of the third edge are both arc surfaces having a much smaller area which are not enough to be called the surface where the transparent cover 1 is located. In addition, the main body of the transparent cover 1 is also a part configured to cover the display area by the transparent cover 1.

As shown in FIG. 1, in this embodiment, the transparent cover 1 is preferably a flat glass cover plate, the glass cover plate has a rectangular portion, and the left and right edges of the glass cover plate are both first edges 101. In this embodiment, the material of the transparent cover 1 is preferably glass, it is used as the preferred material because it has high transparency and is easy for hot bending. Of course, the transparent cover 1 can also be made of other materials, such as highly polymerized transparent materials. At the same time, it is preferable that the glass cover plate has a flat plate portion, so that the transparent cover 1 can be used in conjunction with a flat display screen, and because the shape of the flat display screen is mostly rectangular, the glass cover plate also has a rectangular portion, preferably, the flat plate-shaped portion is rectangular, so that the flat plate portion can be the rectangular portion. More preferably, an overall shape of the transparent cover 1 can be rectangular. When the transparent cover 1 is a flat plate, it is a flat rectangular structure. When the transparent cover 1 is an arc plate, it is formed by bending a rectangular flat plate; that is, it is a curved rectangular structure. Based on this, in four edges of the rectangular transparent cover 1 (the fourth edges do not include the third edge 104, and the third edge 104 is only a rounded edge form from a rectangular corner by connecting the first edge 101 to the second edge 102), preferably, the left edge and the right edge are both the first edge 101, and these two edges are respectively corresponding to a left edge and a right edge of the display screen 2. As such, a display area near the left edge and a display area near the right edge of the display screen 2 are both expanded, and accordingly, a display length of the display screen 2 in a horizontal direction is extended, and the screen ratio can be higher.

At the same time, both ends of a same second edge 102 are each connected to the two first edges 101 by the third edge 104, as shown in FIG. 1. In the four edges of the rectangular transparent cover 1, since both the left and right edges are the first edges 101, both an upper edge and an lower edge of the transparent cover 1 are the second edges 102. Two ends of the two edges 102 are smoothly connected to the two ends of the first edge 101 by the third edge 104. Therefore, among the four corners of the rectangular transparent cover 1, a number of rounded corners set by disposing the third edge 104 may be one, two, three or four. In this embodiment, preferably, two of the four corners can be rounded by disposing the third edge 104, and more preferably, the two rounded corners are located on the two ends of the same second edge 102. That is, two third edges 104 are respectively disposed at both ends of the same second edge 102, and the two third edges 104 are respectively connected to the left edge and the right edge.

Further preferably, in an upper end and a lower end of the first edge 101, only the upper end is connected to the second edge 102 by the third edge 104, and the second edge 102 is an upper edge of the transparent cover 1, as shown in FIG. 1. When the two corners of the transparent cover 1 are rounded and the two rounded corners are located at both ends of the same second edge 102, in order to take into account the aesthetics and practicality of the electronic device, in this embodiment, further preferably, two side corners of the transparent cover 1 are set to be round corners. That is, two top corners of the display component of the electronic device are rounded corners formed by the first edge 101, the third edge 104 and the second edge 102 being connected.

Based on the above-mentioned transparent cover 1 in this embodiment, this embodiment further provides an electronic device, which includes a display screen 2, a transparent cover 1, and a housing 3 for installing the display screen 2. The transparent cover 1 is the above-mentioned transparent cover 1.

In this electronic device, as mentioned above, both edges of the transparent cover 1 covering the left edge and the right edge of the display screen 2 are the first edges 101, so that the display screen 2 can be a full screen in the horizontal direction. The upper edge of the transparent cover 1 covering the top edge of the display screen 2 is the second edge 102; that is, the transparent cover 1 makes the display 2 as a whole a curved screen on the left side and the right side and a flat screen on the upper side and the lower side.

Figure 7:
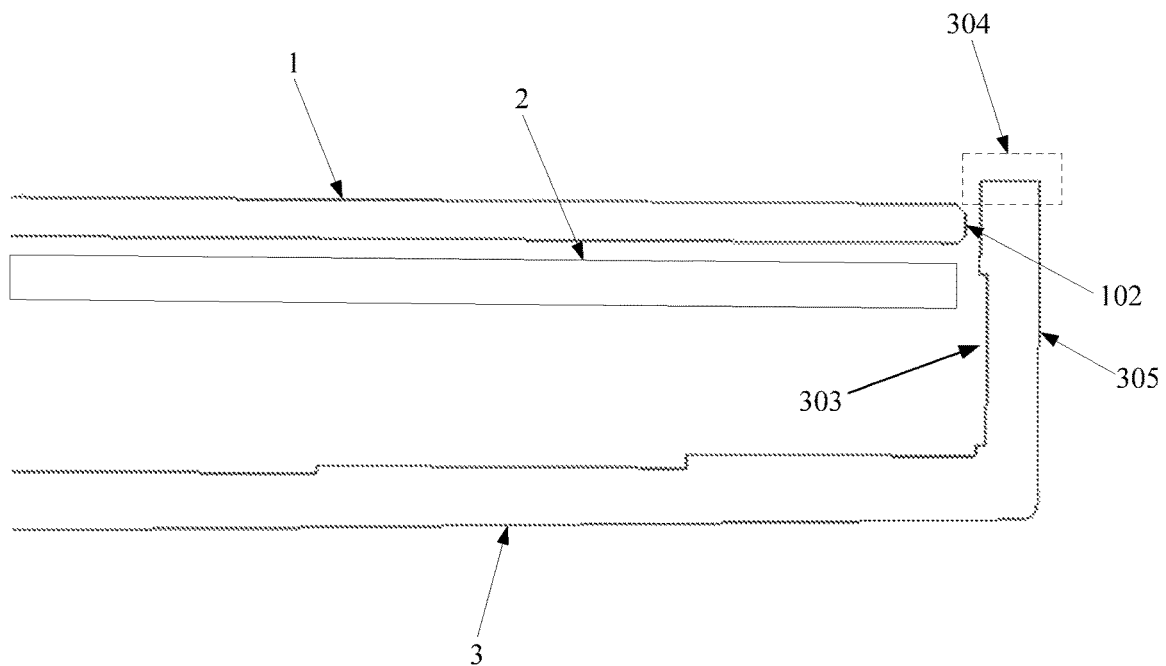
FIG. 7 is a schematic structural diagram of a second edge of the transparent cover fitting to a second side wall of the housing according to some embodiment of the present disclosure.

As shown in FIG. 7, in this embodiment, the housing 3 is further provided with a side wall covering the top edge. The side wall protrudes from the surface of the transparent cover 1, and the surface refers to a surface away from the display screen 2. Since both the transparent cover 1 and the display screen 2 are plate-shaped members, the housing 3 for mounting the two is a concave structure. That is, the housing 3 has a bottom wall and four side walls that are connected to a periphery of the bottom wall and protrude from the bottom, to form a structure having a recessed space in the middle by the bottom wall and the four side walls. The display screen 2 and the transparent cover 1 are disposed in the recessed space. Since both the left edge and the right edge of the transparent cover 1 are curved edges that are curved toward the bottom wall, and in order to ensure the full screen effect in a left-right direction, the two first edges 101 of the transparent cover 1 need to cover the left side wall and the right side wall of the four side walls. That is, when the transparent cover 1 is protruding from the left side wall and the right side wall of the housing 3, and because the transparent cover 1 is a glass plate, once a pressure perpendicular to the display surface is exerted on the electronic device, the transparent cover 1 can be easily caused to crack thereby damaging the electronic device. Therefore, in order to avoid this problem, the side walls of the four side walls of the housing 3 covering the top edge of the display screen 2 and the transparent cover 1 may be protruding from the surface of the transparent cover 1 so that the transparent cover 1 and the display screen 2 can be supported by the side walls thereby reducing the chance to damage the electronic device.

Specifically, the electronic device in this embodiment preferably includes a first body 11 and a second body 12 capable of moving relative to each other. The housing 3, the display screen 2 and the transparent cover 1 are all disposed on the first body 11. Specifically, the electronic device having this structure may be a laptop computer, a flip phone, etc. At the same time, in a state when the first body 11 and the second body 12 fit to each other, the side wall the top edges of the display screen 2 and the transparent cover 1 is covered, and a protruding part abuts against the second body 12 such that there can be a gap between the transparent cover 1 and the second body 12. That is, the transparent cover 1 is suspended with respect to the second body 12 and is not in direct contact with the second body 12. When a pressure is exerted on the first body 11, the pressure is transmitted to the second body 12 by the side wall. As such, the situation that the display screen 2 and the transparent cover 1 are crushed and broken can be avoided. In this embodiment, preferably, each part of the above-mentioned side wall protrudes from the surface of the transparent cover 1 to fully protect the transparent cover 1 and the display screen 2. Of course, under the premise of being able to play a protective role, the side wall may only partially protrude from the surface of the transparent cover 1.

In addition, the electronic device may also include only one body, and the housing 3, the display screen 2 and the transparent cover 1 are disposed on the body. Specifically, the electronic device having this structure may be a tablet computer, a tablet phone, etc.

Based on the transparent cover 1 described above, this embodiment also provides a mold for hot-bending to form the transparent cover 1 described above. The mold includes an upper mold and a lower mold 4, and a first groove 5 configured to form the first edge 101 and a third groove 6 configured to form the third edge 104 are disposed on the upper mold 4 (In order to correspond to the naming of the third edge 104, in the present disclosure, a groove configured to shape the third edge 104 is named the third groove 6. However, there is no "second groove" in this disclosure). Since the first edge 101 and the third edge 104 are both formed by the main body bending with respect to the transparent cover 1, it is necessary to dispose a space on the lower mold 4 that allows it to bend and deform, which is the first groove 5 and the third groove 6. During hot-bending, a flat glass plate can be placed in the lower mold 4 and then heated to soften it, and the upper mold presses over the edges causing the edges to bend and deform. When the curved edge first to groove walls of the first groove 5 and the third groove 6, the formation is completed. After cooling, the glass plate is taken out of the mold, and a transparent cover 1 is obtained.

Figure 4:
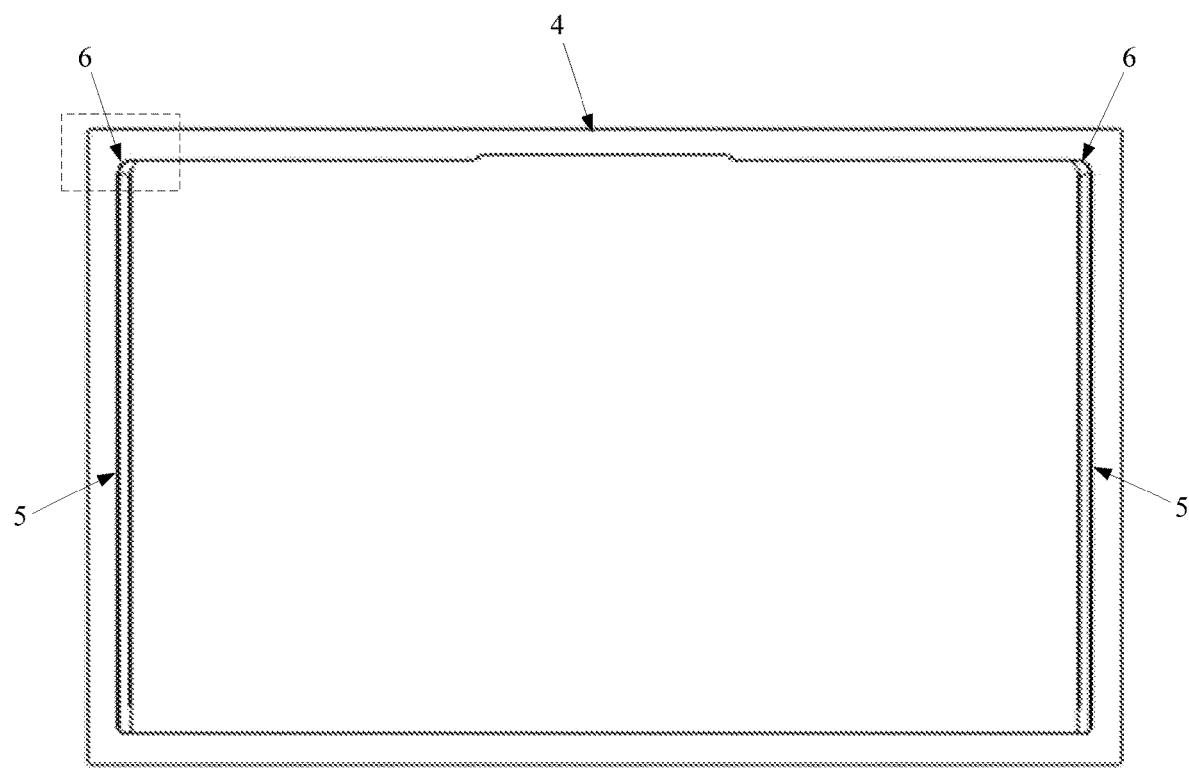
FIG. 4 illustrates a top view of a lower mold according to some embodiment of the present disclosure.
Figure 5:
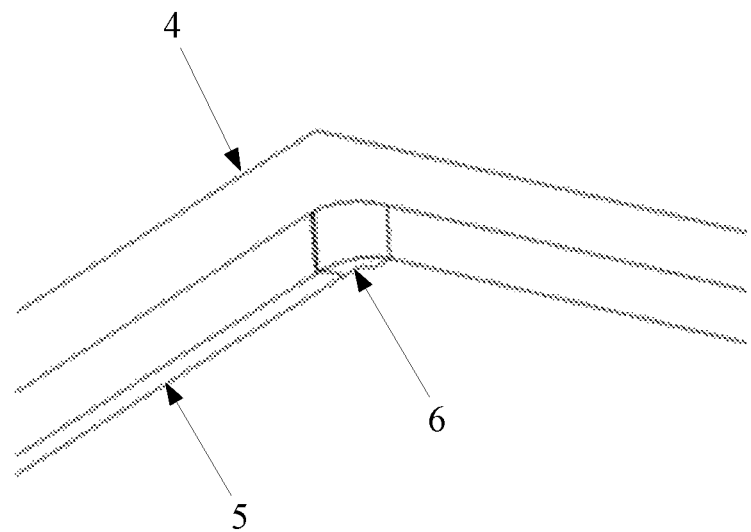
FIG. 5 illustrates a partially enlarged view of FIG. 4.

Specifically, since the transparent cover 1 in this embodiment preferably has a left edge and a right edge as the first edge 101, and the third edge 104 is disposed on top of the two first edges 101, accordingly, when disposing the first groove 5 and the third groove 6, in order to correspond to the above structure of the transparent cover 1, the first groove 5 can be two strip grooves disposed in parallel, and there can be two third grooves 6 which are respectively disposed at the ends on a same side of the two first grooves 5, as shown in FIG. 4.

Based on the above-mentioned transparent cover 1 and the mold, this embodiment also provides a hot-bending method. The method can implement the above-mentioned mold to hot-bend the transparent cover 1. The method includes the following steps: first, processing the right-angled corners of the transparent cover 1 into rounded corners, and placing a flat glass-made transparent cover 1 in the lower mold 4; then, merging the upper mold into the lower mold 4, and exerting a pressure on a portion of the transparent cover 1 that needs to be bent; then, heating the transparent cover 1 to soften the transparent cover 1 causing it to deform. Accordingly, the heated transparent cover 1 deforms under the pressure so that two edges that form the round corner of the transparent cover 1 respectively enter into two third grooves 6 and are formed into the third edges 104. The third edges 104 can fit to the third grooves 6 after the formation, to position the transparent cover 1 on the lower mold 4. The transparent cover 1 continues to deform under pressure, so that the left edge and the right edge of the transparent cover 1 enter the two first grooves 5 respectively and are formed into the first edges 101.

In the above method, various parameters of hot-bending the transparent cover 1 such as the pressure on the transparent cover 1, the heating temperature, etc., can be referred to the various parameters of the existing technologies for glass hot-bending.

Figure 6:
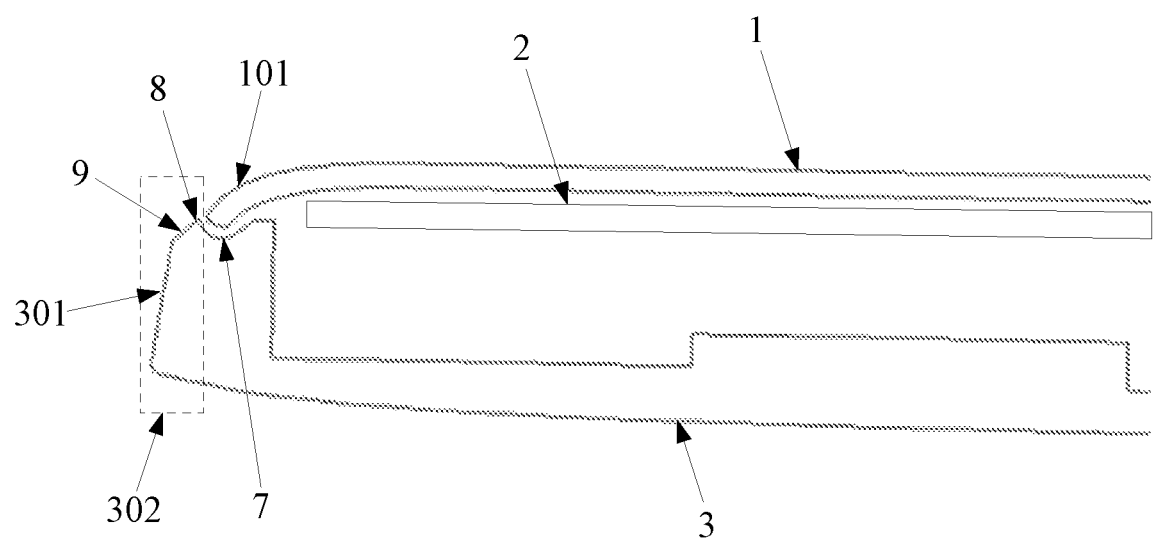
FIG. 6 is a schematic structural diagram of a first edge of a transparent cover fitting to a first side wall of a housing according to some embodiment of the present disclosure.

According to some embodiment of the present disclosure, as shown in FIGS. 6 and 7, a display component is provided. The display component mainly includes a display screen 2, a supporting member, and a transparent cover 1. The display screen 2 is mounted on the supporting member and the transparent cover 1 covers the display screen 2. Of all edges of the transparent cover 1, a number of the edges are first edges 101, which are arc edges formed of regular edges of the transparent cover 1 bending toward one side of the transparent cover 1. In the above structure, a direction indicated by one side is a direction perpendicular to the surface where the transparent cover 1 is located before bending, and the regular edges refer to the edges that are coplanar with the overall transparent cover 1; that is, the first edges 101 are curved edges formed by bending.

In the above-mentioned display component, because the transparent cover 1 has a first edge 101, by covering the edge of the display screen 2 with the first edge 101, the area of the display area can be expanded, and the screen ratio can be increased. When a user uses an electronic device having the foregoing-described display components, the use experience can be improved.

As shown in FIG. 1, in this embodiment, the transparent cover 1 is preferably a flat glass cover plate, the glass cover plate has a rectangular portion, and the left edge and the right edge of the glass cover plate are both first edges 101. In this embodiment, the material of the transparent cover 1 is preferably glass. It is the preferred material because it has high transparency and is easy for hot-bending. Of course, the transparent cover 1 can also be made of other materials such as highly polymerized transparent materials, etc. At the same time, the preferred glass cover plate has a flat plate portion, so that the transparent cover 1 can be used in conjunction with the flat display screen 2, and since the shape of the flat display screen 2 is mostly rectangular, the glass cover plate also has a rectangular portion, the preferred flat plate portion is rectangular, so that the flat plate portion is the rectangular portion. More preferably, an overall shape of the transparent cover 1 is rectangular. When the transparent cover 1 is a flat plate, it has a flat rectangular structure. Based on this, of all the four edges of the rectangular transparent cover 1, preferably, both the left side and the right edge are the first edges 101, and these two edges are respectively disposed corresponding to the left and right edges of the display screen 2, so that a display area near the left edge and the right edge of the display screen 2 are expanded, and a display length of the display screen 2 in the horizontal direction can be extended, thereby increasing the screen ratio.

In addition, the transparent cover 1 may also be a curved glass cover plate, and the curved glass cover plate has a portion corresponding to a rectangular projection in a vertical plane. The curved transparent cover 1 is curved as a whole, and preferably, an overall shape of the curved transparent cover 1 is rectangular. That is, the curved glass cover plate is bent from a rectangular flat plate, which is a curved rectangular structure. When at least one edge of the curved glass cover plate is in a vertical direction, the curved glass cover plate is shined with horizontal light, and the projection shape of the curved glass cover plate on the vertical plane is rectangular. In this embodiment, similar to the above-described flat glass cover, preferably, both the left edge and the right edge of the curved glass cover are the first edges 101.

In this embodiment, preferably, the supporting member has a first side wall 301 that fits to the first edge 101. A mounting groove 7 is disposed on a surface of the first side wall 301 that fits to the first edge 101. The first edge 101 that is inserted into the mounting groove 7 fits to the mounting groove 7, as shown in FIG. 6. Since the first edge 101 is a curved edge formed by bending, in order to better fits to the curved edge, the mounting groove 7 is disposed on the horizontal surface of the top of the first side wall 301, so that the first edge 101 can be inserted into this mounting groove 7, thereby improving the assembly accuracy of the transparent cover 1 and the supporting member.

As shown in FIG. 6, the mounting groove 7 has an outer edge 8 disposed near the outer surface of the housing 3. A height of the outer edge 8 is not greater than a height of the cross-section of the first edge 101, and there is a gap between the cross-section of the first edge 101 and wall surfaces of the mounting groove of 7. In this embodiment, when the first edge 101 is inserted into the mounting groove 7, and if an outer edge 8 of the mounting groove 7 is made to protrude from the height of the cross-section of the first edge 101, then from the perspective when facing the display surface, an effect that the edge of the transparent cover 1 is wrapped may be generated, which affects the full-screen display effect in a left-right direction of the display component. Accordingly, in order to avoid this and further improve the full-screen visual effect in the left-right direction of the display component, preferably, the height of the outer edge 8 is not greater than the height of the cross-section of the first edge 101. It is more preferable that the height of the outer edge 8 the same as the highest point of the cross-section of the first edge 101, so that a joint portion of the transparent cover 1 and the supporting member can be connected smoothly, which avoids affecting the appearance of the display component due to an exposure of a cross-section of the transparent cover 1. A gap is disposed between the cross-section of the first edge 101 and a wall surface of the mounting groove 7, and a buffer space is reserved for the two to avoid a rigid collision between the two when subjected to an impact force, thereby ensuring the safety of the transparent cover 1.

Further, as shown in FIG. 6, the first side wall 301 has a first protrusion 302 located outside a coverage area of the transparent cover 1, and a chamfer 9 is disposed at a top end of the first protrusion 302. An inclined plane that forms the chamfer 9 is the cross-section of the first edge 101. The size of the chamfer 9 is 0.3 mm to 0.5 mm. Since an extension line of a straight in the inclined plane can be tangent to an arc surface formed by the first edge 101 (The arc surface can be regarded as a surface where a partial arc of a circle is located.), the inclined plane is called a tangent plane to the first edge 101, so that the first side wall 301 has the first protrusion 302. The first protrusion 302 protrudes in a horizontal direction from an area covered by the transparent cover 1. That is, the first protrusion 302 surrounds the periphery of the transparent cover 1, such that when the display component is subjected to a lateral impact force due to a fall or a collision, the first protrusion 302 can withstand the impact force to prevent the transparent cover 1 and the display screen 2 from being damaged. At the same time, setting the inclined plane as the tangent plane to the first edge 101 can make the connection between the supporting member and the transparent cover 1 more smooth, which not only improves the visual effect of the full screen, but also improves the appearance of the display component. In addition, a horizontal dimension of a portion cut off due to a formation of the chamfer 9 on the first protrusion 302 is preferably 0.3 mm to 0.5 mm, so as to ensure that the formed chamfer 9 can better match with the first edge 101.

Based on the above display component, this embodiment also provides an electronic device. The electronic device includes a display component and an electronic circuit. The display component is the above-mentioned display component, and the supporting component constitutes the housing 3 of the electronic device. The electronic circuit is disposed in the housing 3. An electronic device of this structure has only one body, that is, a body composed of a display component and an electronic circuit. Specifically, the electronic device may be a tablet computer, a tablet phone, etc.

Based on the display component described above, this embodiment also provides an electronic device having a different structure. The electronic device includes a first body 11 and a second body 12 capable of moving relative to each other. The first body 11 includes the display component and the supporting component described above. The supporting member constitutes the housing 3 of the first body 11. The housing 3 has a second side wall 303 that is connected to a top edge of the display screen 2, and the second side wall 303 has a second protruding portion 304 protruding from a top surface of the transparent cover 1 (The second side wall 303 and its second protruding portion 304 are the same as the side wall of the top edge of the display screen 2 and the transparent cover 1 and its protruding portion of the above embodiment.). In a state when the first body 11 is fitting to the second body 12, the second protrusion 304 can provide a gap between the transparent cover 1 and the second body 12. Specifically, in a state when the first body 11 is fitting to the second body 12, the second protruding portion 304 on the second side wall 303 abuts against the second body 12 so that there can be a gap between the transparent cover 1 and the second body 12. That is, the transparent cover 1 is suspended relative to the second body 12 and is not in direct contact with the second body 12. When a pressure is exerted on the first body 11, the pressure is transmitted to the second body 12 by the side wall. As such, the situation that the display screen 2 and the transparent cover 1 are crushed and broken can be avoided. In this embodiment, it is preferable that the second protrusion 304 are distributed on a top of the entire second side wall 303 to fully protect the transparent cover 1 and the display screen 2. Of course, under the premise of being able to play a protective role, the second protruding portion 304 may be disposed only on a partial region of the second side wall 303. In addition, such an electronic device having two bodies may specifically be a laptop computer, a flip phone, etc.

In this embodiment, regardless of whether the electronic device has the first structure, or the second structure described above, it has the following structure.

Both the left and right edges of the transparent cover 1 are the first edges 101. The upper edge and the lower edge of the transparent cover 1 are the second edges 102, and the second edge 102 is coplanar with the main body of the transparent cover 1. The main body refers to other parts of the transparent cover 1 except for the first edge 101. For example, when the transparent cover 1 is a flat plate, the main body refers to other flat parts except for the first edge 101. When the transparent cover 1 is an arc-shaped plate, the main body refers to all arc portions formed on the entire transparent cover 1. In addition, the main body of the transparent cover 1 is also a part of the transparent cover 1 for covering the display area. Of the four edges of the rectangular transparent cover 1, the left edge and right edge are preferably the first edges 101, and these two edges are respectively disposed corresponding to the left edge and the right edge of the display screen 2, so that the display area near the left edge and the right edge of the display screen 2 can be expanded, and the display length of display screen 2 in a horizontal direction can be extended, thereby increasing the screen ratio. The upper edge and the lower edge are set to be edges of a surface that are coplanar with the main body of the transparent cover 1, so that they can better fit to the supporting member.

According to some embodiment of the present disclosure, as shown in FIGS. 8 to 14, a display component is provided. The display component mainly includes a display screen 2 and a transparent cover 1. The transparent cover 1 covers the display 2. The transparent cover 1 includes a first portion 105 and a second portion 106. The first portion 105 covers a display area of the display screen 2, and a shape of a projection of the first portion 105 on a reference plane is substantially rectangular, more preferably a rectangle and the second portion 106 extends outward from the first portion 105 to form a protruding portion.

In the display component of the above structure, the transparent cover 1 has a first portion 105 specifically matching the display area of the display screen 2. That is, an area of the display screen 2 covered by the first portion 105 is the display area of the display screen 2, and a shape of the projection of the first portion 105 in the reference plane is substantially rectangular, so that the display area matching the first portion 105 also has a rectangular, the display area can be larger and more complete and there is no display blind area, which improves user experience and the appearance of the display component.

Specifically, the second portion 106 may be located at least in a plurality of different parts of the first portion 105, e.g., located on an upper side, a left side, a right side, an upper left corner, or an upper right corner of the first portion 105. In this embodiment, it is preferable that the second portion 106 is located at an upper middle part of the first portion 105, as shown in FIG. 1.

In this embodiment, the transparent cover 1 is a flat glass cover plate, and the reference plane at this time refers to the plane on which the transparent cover 1 is located; or, the transparent cover 1 is a curved glass cover plate, and the reference plane are the surfaces where the four corners of the curved glass cover are located. That is, the transparent cover can form a substantially rectangular projection. Alternatively, the transparent cover 1 is a spherical glass cover, and the reference plane at this time is a surface formed by cutting the spherical ball. The surface may be a circular plane or a polygonal plane such as a rectangle. In this embodiment, the reference plane is preferably a vertical plane. And the projection of the display area of the display screen 2 on the reference plane is rectangular; that is, the display area is a regular polygonal area, all edges of the projection are straight edges, and there is no blind area with any shape of notch in the display area.

Based on the above display component, according to this embodiment, an electronic device is provided, including: a display component; a housing 3, which is configured to install a display component; and a sensor 10. The display component includes a display screen 2, a transparent cover place 1 which covers the display screen 2. The transparent cover 1 includes a first portion 105 and a second portion 106. The first portion 105 covers the display area of the display screen 2, and the projection shape of the first portion 105 on the reference plane is substantially rectangular. The second portion 106 extends outward from the first portion 105 to form a protruding portion, and the second portion 106 covers a sensor 10. Since the second portion 106 is preferably disposed at an upper middle portion of the first portion 105 in this embodiment, the sensor 10 is preferably disposed at the upper middle portion of the display screen 2, and the sensor 10 is preferably a camera.

Figure 8:
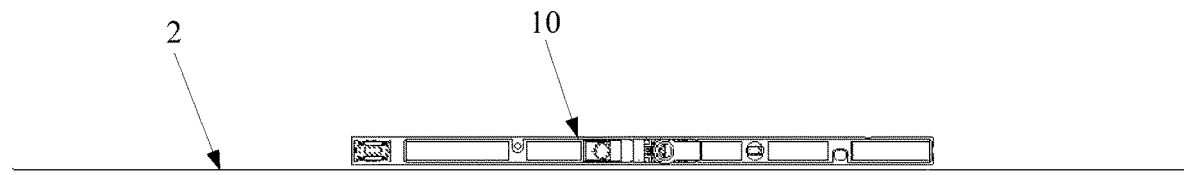
FIG. 8 is a schematic structural diagram of a relative position of a display screen to a sensor according to some embodiment of the present disclosure.

Preferably, as shown in FIG. 8, a height of the top edge of the display area of the display screen 2 is shorter than a height of the sensor 10. The housing 3 has a top wall 305 that covers a top edge of the transparent cover 1 and at the same time, the top wall 305 also covers a top edge of the display screen 2 and a top edge of the sensor 10, and the top wall 305 forms a step structure, as shown in FIGS. 9-14. The step structure includes a first step surface 3051, a second step surface 3052, and a connecting surface 3053 that connects the first step surface 3051 to the second step surface 3052. The first step surface 3051 is a surface of the top wall 305 that covers a surface of the second portion 106 (a first coverage area mentioned in the subsequent content), and the second step surface 3052 is a surface of the top wall 305 that covers a surface of the first portion 105 (a second coverage area mentioned in the subsequent content). The second step surface 3052 is disposed inclinedly relative to the first step surface 3051 and intersects with the first step surface 3051, so that the connecting surface 3053 is a triangular surface, as shown in FIGS. 9, 10, 13 and 14. In this embodiment, since the second portion 106 of the transparent cover 1 protrudes from an upper side of the first portion 105 of the transparent cover 1 and the sensor 10 is disposed on the upper side of the display screen 2. Accordingly, the top wall 305 that covers the transparent cover 1, the display screen 2 and the housing 3 of the sensor 10 also has a step structure relative to the structure of the transparent cover 1 and relative positions of the display screen 2 and the sensor 10, and such a step structure may be a step structure of common sense; that is, the first step surface 3051 and the second step surface 3052 are disposed in parallel but have different heights, and the connecting surface 3053 connects the first step surface 3051 to the second step surface 3052 vertically. When the display surface of the display component is in a vertical position (such as when a laptop screen opens to the 90 degree position), the first step surface 3051 and the second step surface 3052 are set to be horizontal, and the connecting surface 3053 is set to be vertical. However, in order to improve the appearance of the display component and the electronic device, it is preferred in this embodiment that the first step surface 3051 and the second step surface 3052 are not disposed in parallel; that is, a surface of the top wall 305 of the first portion 305 is not disposed in parallel with a surface of the first portion 105 that covers the second portion 106 of the transparent cover 1. That is, the second step surface 3052 is inclined with respect to the first step surface 3051 and intersects the first step surface 3051, so that the connecting surface 3053 that connects the first mesa 3051 to the second mesa 3052 is a triangular surface enclosed by the first step surface 3051, the second step surface 3052, and the vertical surface.

Further, the top wall 305 of the housing 3 has a first top edge 3054 adjacent to the transparent cover 1 and a second top edge 3055 far from the transparent cover 1. The first top edge 3054 has a sub-edge 3056 adjacent to the first portion 105 and a second sub-edge 3057 adjacent to the second portion 106. A height of the second sub-edge 3057 is substantially the same as a height of the second top edge 3055, and the height of the second top edge 3055 is higher than the height of the first sub-edge 3056, as shown in FIGS. 9-14. That is, when the display surface of the display component is vertical, the surface of the top wall 305 covering the second portion 106 is horizontal. That is, the first step surface 3051 is horizontal. And the surface of the top wall 305 covering the first portion 105 is inclined; that is, the second step surface 3052 is an inclined surface. As such, the connecting surface 3053 of the step structure can be made into a triangular surface, which improves the appearance of the display component and the electronic device, and also make the step structure more protruding, which facilitates an exertion of a force to the electronic device when the electronic device is turned over (details are described as follows).

The preferred electronic device in this embodiment includes a first body 11, a display part, a housing 3 and a sensor 10 disposed on the first body 11, and a second body 12 which is movably connected to the first body 11 to implement a relative movement to each other. The electronic device having such a structure may be a laptop computer, a flip phone, etc. In addition, the second portion 106 protruding from the top edge of the first body 11 (the top edge of the first body 11 is the top wall 305 covering the first portion 105 of the transparent cover 1) and/or the step structure constitute a force receiving portion that enables a rotation of the first body 11 relative to the second body 12. Since the second portion 106 and/or the step structure are located at a middle portion of the top edge of the first body 11, when the electronic device is in a folded state, the second portion 106 and/or the step structure not only protrude from the edge of the first body 11 but also protrude from the edge of the second body 12. So when the electronic device is opened; that is, when the first body 11 and the second body 12 move relative to each other, the protruding second portion 106 and/or the step structure are more easily grasped by the which facilitates the exertion of a force to the electronic device. Accordingly, the second portion 106 and/or the stepped structure become the force receiving portion that causes the first body 11 to rotate relative to the second body 12, so that the user can easily flip and unfold the electronic device.

In addition, the electronic device may further include only one body, and the display component, the housing 3, and the sensor 10 are all disposed on the body. The electronic device of this structure may be a tablet computer, a tablet phone, etc. When the electronic device has only one body, the electronic circuit is disposed in the body; and when the electronic device has the first body 11 and the second body 12, electronic circuits are disposed in both the first body 11 and the second body 12 and the electronic circuits are coupled under operation.

In this embodiment, the top wall 305 includes a first coverage area for covering the second portion 106 and a second coverage area for covering the first portion 105. The second coverage area is coplanar with the top wall 305 of the second body 12, as shown in FIGS. 9-14. That is, in a preferred structure, the first body 11 covers the top wall 305 (that is, the second coverage area) of the first portion 105 of the transparent cover 1 and is coplanar with the top wall 305 of the second body 12, to improve the appearance of electronic device. Specifically, the surface where a part of the top wall 305 of the first body 11 and the top wall 305 of the second body 12 are located may be flat or curved.

Figure 9:
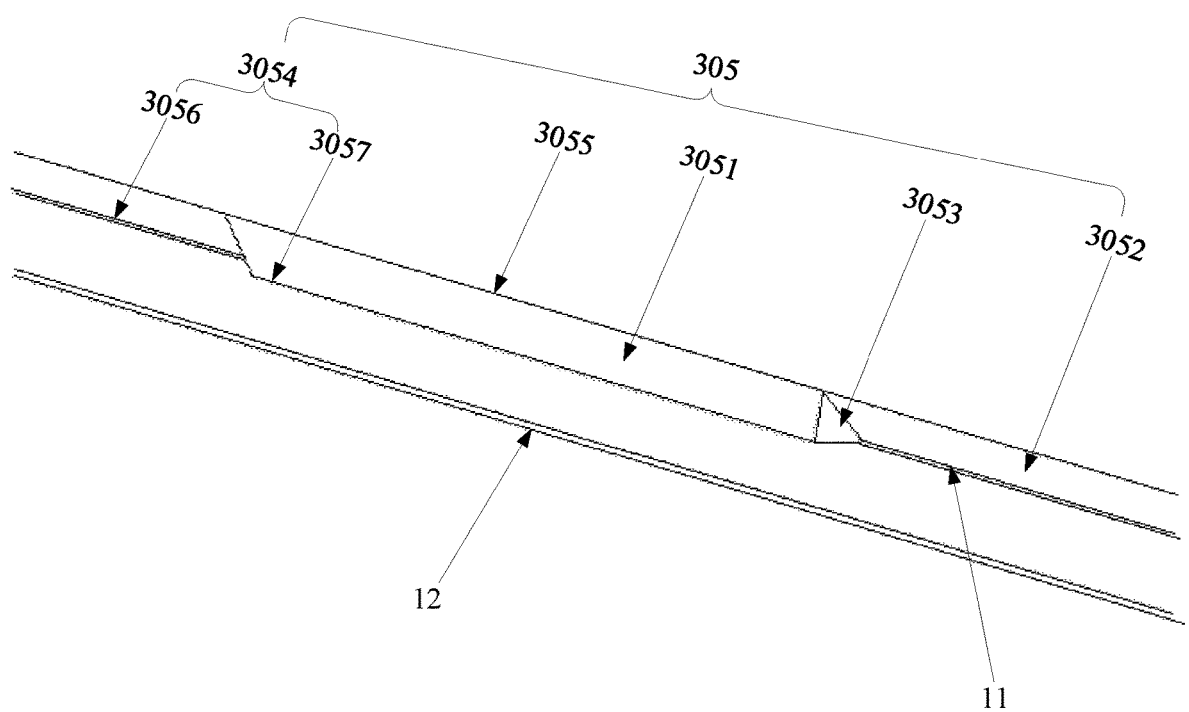
FIG. 9 illustrates an isometric view of a top wall of a first body fitting to a top wall of a second body in a first type of structure according to some embodiment of the present disclosure.
Figure 10:
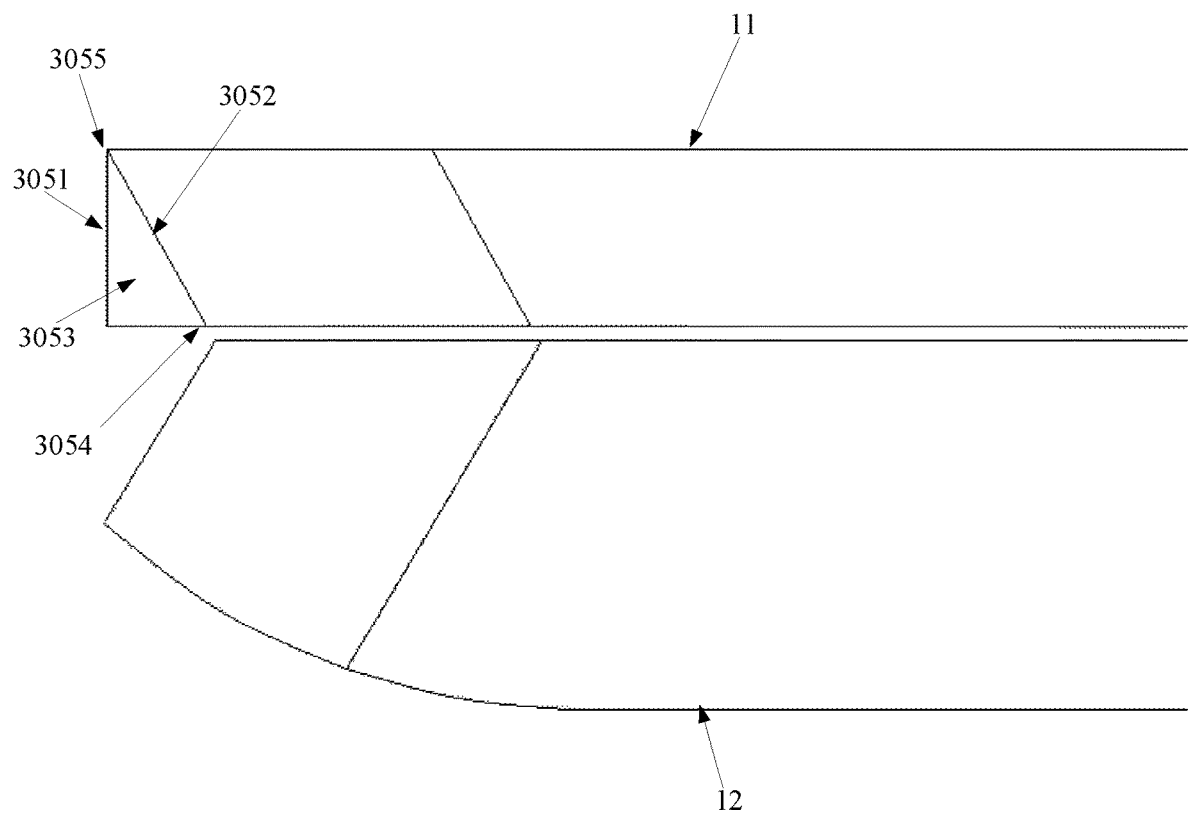
FIG. 10 illustrates a side view of the top wall of the first body fitting to the top wall of the second body as shown in FIG. 9.

As shown in FIGS. 9 and 10, the top wall 305 includes a first coverage area for covering the second portion 106 and a second covering area covering the first portion 105. The second coverage area and the top wall 305 of the second body 12 are on two different surfaces, and there is an angle between these two surfaces. That is, in another preferable structure, the second coverage area of the first body 11 are not coplanar with the top wall 305 of the second body 12. Similarly, the surface where the second coverage area and the top wall 305 of the second body 12 are located can be flat or curved. In this embodiment, it is preferable that the surface where the top wall 305 of the first body 11 that covers the first portion 105 of the transparent cover 1 and the surface where the top wall 305 of the second body 12 is located are both flat, and the two surfaces intersect at where the first body 11 fits to the second body 12, as shown in FIG. 10.

Figure 11:
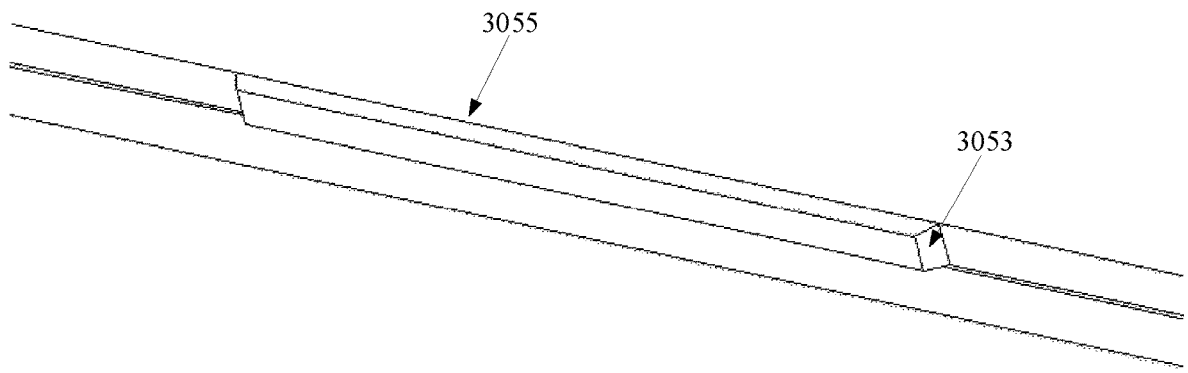
FIG. 11 illustrates an isometric view of the top wall of the first body fitting to the top wall the second body in a second type of structure according to some embodiment of the present disclosure.
Figure 12:
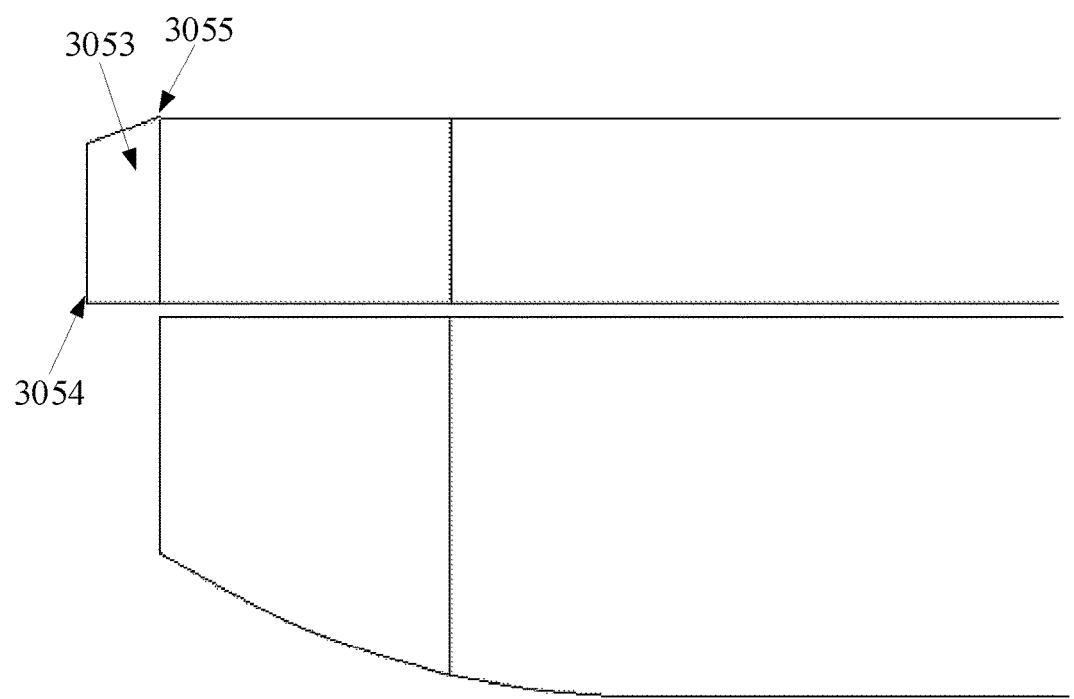
FIG. 12 illustrates a side view of the top wall of the first body fitting to the top wall of the second body as shown in FIG. 11.
Figure 13:
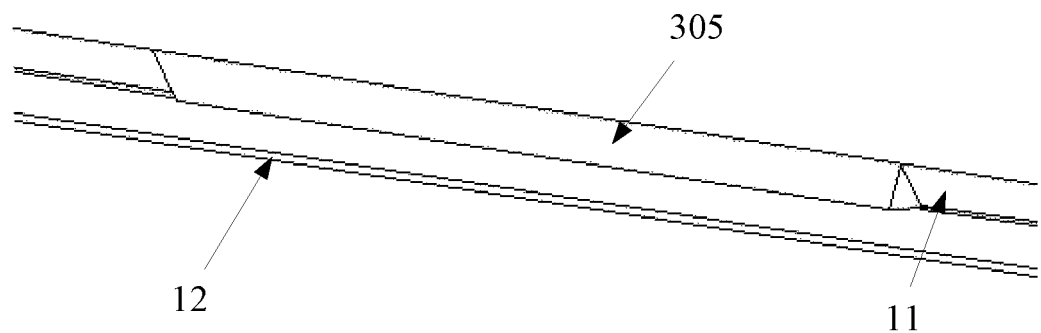
FIG. 13 illustrates an isometric view of the top wall of the first body fitting to the top wall of the second body in a third type of structure according to some embodiment of the present disclosure.
Figure 14:
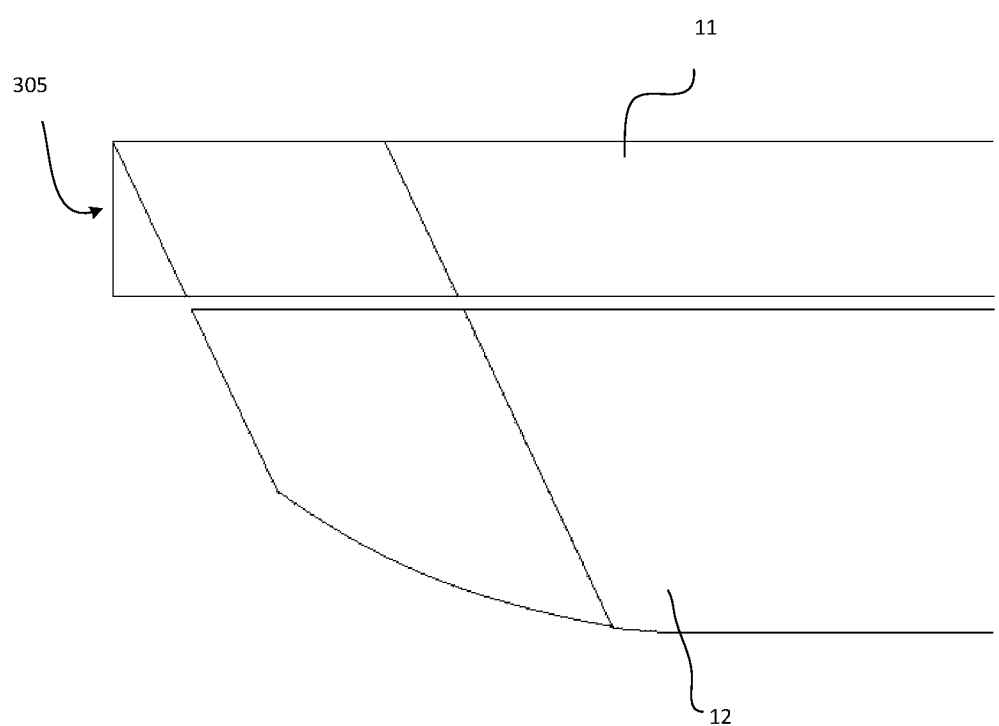
FIG. 14 illustrates a side view of the top wall of the first body fitting to the top wall of the second body as shown in FIG. 13.

Under the premise that the second coverage area is coplanar with the top wall 305 of the second body 12, there may also be multiple options for the fitting between the two and the first coverage area. For example, the first coverage area, the top wall 305 of the second body 12, and the second coverage area are each perpendicular to the reference plane (that is, the vertical plane) when the first body 11 expands to 90 degrees relative to the second body 12. When the first body 11 and the second body 12 are fitting to each other at 0 degrees, In the fitted state, the first coverage area, the top wall 305 of the second body 12 and the second coverage area are in a vertical state, as shown in FIG. 11 and FIG. 12. Alternatively, when the first body 11 expands to 90 degrees relative to the second body 12, the second coverage area is perpendicular to the reference plane, the first coverage area and the top wall 305 of the second body 12 are on a same surface, and there is an angle between this surface and the reference plane, as shown in FIG. 13 and FIG. 14 (The structures of the first coverage area, the top wall 305 of the second body 12, and the second coverage area when the first body 11 and the second body 12 are fitting to each other at 0 degree are shown in the drawing.). Both of these disposition methods can meet the operating requirements and aesthetic requirements of the display component and the electronic device, and therefore, they are also the preferred disposition methods of this embodiment.

In the present specification, the structure of each part is described in a progressive manner. The structure of each part focuses on the distinctions from the existing structure. The entire or partial structure of the transparent cover, display component, and the electronic device can be obtained by combining the structure of the several parts mentioned above.

The above description of the disclosed embodiments enables those skilled in the art to implement or use the present disclosure. Various modifications to these embodiments can be apparent to those skilled in the art, and the general principles defined in the present disclosure may be implemented in other embodiments without departing from the spirit or scope of the present disclosure. Therefore, the present disclosure is not limited to the embodiments disclosed in the present disclosure, but should be commensurate with the largest scope consistent with the principles and novelties disclosed in the present disclosure

What is claimed is:

1. A display component, comprising: a display screen; and a transparent cover covering the display screen and a camera disposed near a top edge of the display screen, the transparent cover including a first portion and a second portion, the first portion covering a display area of the display screen, a shape of a projection of the first portion on a reference plane paralleled to the display area being substantially rectangular, and the second portion, being narrower than a long side edge of the rectangular, extending outward from the long side edge of the first portion to form a protruding portion and to cover the camera thereunder, wherein a top edge of the second portion of the transparent cover is covered by a top portion of an external housing of the display component having a step structure including a first step surface as a part of the top portion of the housing covering the top edge of the second portion of the transparent cover, a second step surface as another part of the top portion of the housing covering a top edge of the long side edge of the first portion of the transparent cover, and a triangular third step surface connecting the first step surface and the second step surface.

2. The display component according to claim 1, further comprising: a supporting member for installing the display screen, wherein:
the transparent cover including a first edge, the first edge being an arc edge formed by bending the first edge of the transparent cover towards one side of the transparent cover.

3. The display component according to claim 1, wherein the second portion is located at an upper side, a left side, a right side, an upper left corner, or an upper right corner, of the first portion.

4. The display component according to claim 1, wherein:
the transparent cover is a flat glass cover, and the reference plane is a plane where the transparent cover is located; or
the transparent cover is a curved arc-shaped glass cover, and the reference plane is a plane where the four corners of the curved glass cover are located;
wherein a projection of the display area of the display screen on the reference plane being substantially rectangular.

5. The display component according to claim 2, wherein:
the first portion of the transparent cover is a flat glass cover plate, and a left edge and a right edge of the flat glass cover plate are each part of the first edge.

6. The display component according to claim 2, wherein:
the transparent cover is a curved arc-shaped glass cover plate having a rectangular portion of a projection on a vertical plane, and both a left edge and a right edge of the arc-shaped glass cover are each part of the first edge.

7. The display component according to claim 2, wherein:
the supporting member has a first side wall fitting to the first edge, a mounting groove being disposed on a surface of the first side wall fitting to the first edge, the first edge being inserted into the mounting groove fitting to the mounting groove.

8. The display component according to claim 7, wherein the mounting groove has an outer edge disposed near an outer surface of a housing, a height of the outer edge being not greater than a height of a cross-section of the first edge, and there being a gap between the cross-section of the first edge and a wall surface of the mounting groove.

9. The display component according to claim 7, wherein:
the first side wall has a first protruding portion located outside a coverage area of the transparent cover plate, a chamfer being disposed at a top end of the first protruding portion, an inclined plane forming the chamfer being a tangential surface of the first edge, and a dimension of the chamfer being 0.3 mm to 0.5 mm; and
the transparent cover has a second edge, the supporting member having a second side wall covering the second edge, and the second side wall protruding from a surface of the transparent cover away from the display screen.

* * * * *